United States Patent
Losehand et al.

(10) Patent No.: US 6,842,083 B2
(45) Date of Patent: Jan. 11, 2005

(54) COMPONENT HAVING AN INTEGRATED RADIOFREQUENCY CIRCUIT

(75) Inventors: Reinhard Losehand, München (DE); Hubert Werthmann, München (DE); Ulf Bartl, München (DE)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 10/268,176

(22) Filed: Oct. 10, 2002

(65) Prior Publication Data

US 2003/0067362 A1 Apr. 10, 2003

Related U.S. Application Data

(63) Continuation of application No. PCT/EP01/02871, filed on Mar. 14, 2001.

(30) Foreign Application Priority Data

Apr. 10, 2000 (EP) .............................................. 00107704

(51) Int. Cl.[7] .................................................. H03L 7/00
(52) U.S. Cl. ...................... 331/179; 331/36 C; 327/554
(58) Field of Search .............................. 331/175, 179, 331/36 C, 17, 167, 117 R; 327/554

(56) References Cited

U.S. PATENT DOCUMENTS

| 3,909,748 | A |   | 9/1975  | Yuan et al. ............. 331/117 R |
| 4,216,451 | A |   | 8/1980  | Nishimura et al. .......... 334/15 |
| 4,573,025 | A |   | 2/1986  | McKinzie, III ......... 331/117 D |
| 4,999,589 | A | * | 3/1991  | DaSilva .................. 331/117 R |
| 5,182,528 | A | * | 1/1993  | Zuta ........................... 331/1 A |
| 5,686,864 | A | * | 11/1997 | Martin et al. ............... 331/1 A |
| 5,745,012 | A |   | 4/1998  | Oka et al. ..................... 331/68 |
| 5,821,838 | A |   | 10/1998 | Suzuki et al. ................. 334/47 |
| 6,011,432 | A | * | 1/2000  | Fratti et al. ................. 327/554 |
| 6,091,304 | A | * | 7/2000  | Harrer ......................... 331/10 |
| 6,133,797 | A | * | 10/2000 | Lovelace et al. ............. 331/17 |
| 6,407,633 | B1 | * | 6/2002 | Dao ............................ 330/86 |

FOREIGN PATENT DOCUMENTS

| JP | 59 108 432 A   | 6/1984  |
| JP | 04 326 282 A   | 11/1992 |
| JP | 05 167 346 A   | 7/1993  |
| JP | 08 125 496 A   | 5/1996  |
| JP | 09 102 714 A   | 4/1997  |
| JP | 09 162 703 A   | 6/1997  |
| JP | 11 330 856 A   | 11/1999 |
| WO | WO 98/28759    | 7/1998  |

OTHER PUBLICATIONS

Rohde, U. L.: "Microwave and Wireless Synthesizers", John Wiley & Sons, Inc., New York, 1997, pp. 62–64.

* cited by examiner

Primary Examiner—Benny Lee
Assistant Examiner—Joseph Chang
(74) Attorney, Agent, or Firm—Laurence A. Greenberg; Werner H. Stemer; Ralph E. Locher

(57) ABSTRACT

A conductor network includes trimming capacitors and is connected in parallel with a resonant circuit. The trimming capacitors can be connected in parallel with the variable-capacitance diodes in the resonant circuit through PIN diodes, enabling trimming of the resonant circuit.

17 Claims, 1 Drawing Sheet

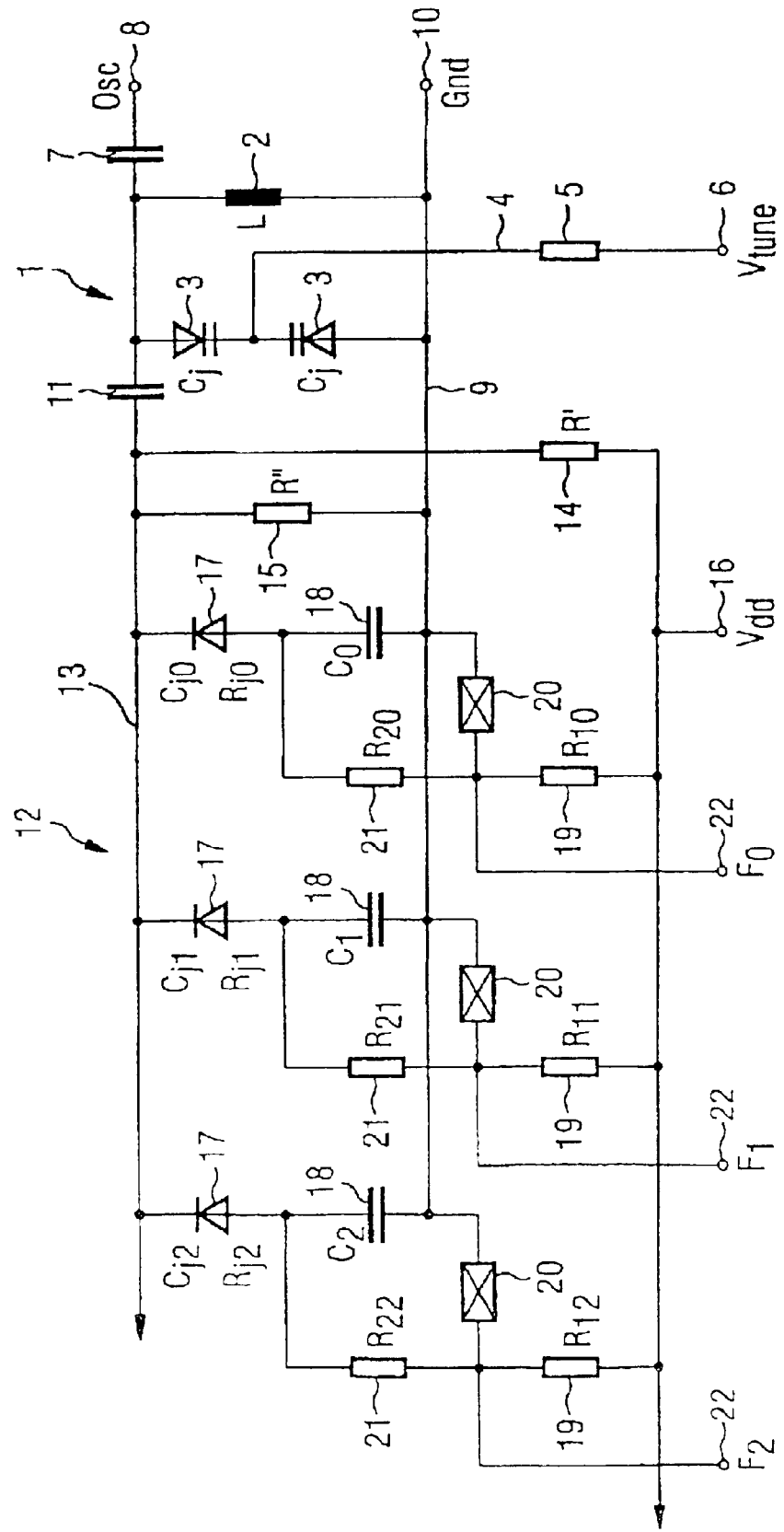

COMPONENT HAVING AN INTEGRATED RADIOFREQUENCY CIRCUIT

CROSS-REFERENCE TO RELATED APPLICATION

This application is a continuation of copending International Application No. PCT/EP01/02871, filed Mar. 14, 2001, which designated the United States and was not published in English.

BACKGROUND OF THE INVENTION

Field of the Invention

The invention relates to a component having an integrated radiofrequency circuit, which has a resonant circuit with an oscillator capacitance having a value that can be set for a predetermined frequency range by a tuning diode.

To date, integrated components have not been used for resonant circuits or signal generators in the frequency range from 1.5 to 3 gigahertz. At the present time, either discrete coils and variable-capacitance diodes are employed or modules including a plurality of integrated components in a housing are used.

However, there is a need for integrated components with resonant circuits or signal generators. In particular, tunable, voltage-controlled integrated components are required. The customary circuits for voltage-controlled resonant circuits contain at least one tuning diode, at which a DC voltage connected in a polarity counter to the forward direction is present as bias voltage. The junction capacitance of the tuning diode is, then, a monotonic function of the bias voltage. Therefore, the resonant circuit is provided with a voltage-regulated capacitance that can be used to set the resonant frequency of the resonant circuit. In such a case, the bias voltage serves for traversing the frequency band that can be utilized.

The specification of a finished integrated component having a resonant circuit also contains a defined relationship between bias voltage and resonant frequency. However, because the electrical properties of all the circuit elements can fluctuate in a tolerance range, a possibility for trimming the resonant frequency of the resonant circuit must exist.

The book "Microwave and Wireless Synthesizers" by Ulrich L Rohde, New York 1997, pages 62 and 63, discloses performing the fine control of a resonant circuit with a tuning diode at which a DC voltage connected in a polarity counter to the forward direction is present as bias voltage. Provided in parallel with the tuning diode are two second and third tuning diodes that are connected in mutually opposite polarity and between which a DC voltage is present as bias voltage, by which coarse control of the resonant frequency of the resonant circuit can be performed.

SUMMARY OF THE INVENTION

It is accordingly an object of the invention to provide a component having an integrated radiofrequency circuit that overcomes the hereinafore-mentioned disadvantages of the heretofore-known devices of this general type and that provides an integrated component having a tunable and trimmable, voltage-controlled resonant circuit.

With the foregoing and other objects in view, there is provided, in accordance with the invention, an integrated radiofrequency circuit component, including a tuning diode, a resonant circuit connected to the tuning diode, the resonant circuit having a resonant frequency and an oscillator capacitance having a value set in a predetermined frequency range by the tuning diode, a coupling capacitance connected to the resonant circuit, and a conductor network for compensation of production related deviations in the resonant frequency, the conductor network being coupled to the resonant circuit through the coupling capacitance and having series-path lines, series-connected parallel-path diodes each having an operating point, the series-connected parallel-path diodes disposed between the series-path lines, parallel-path capacitances disposed between the series-path lines, and a switchable DC voltage network, the parallel-path diodes and the parallel-path capacitances respectively being connected in parallel with the oscillator capacitance when the operating point of the parallel-path diodes is set with the DC voltage network.

According to the invention, the production-dictated deviations in the resonant frequency of the resonant circuit can be compensated for by a conductor network, which is coupled to the resonant circuit through a coupling capacitance and has, between series-path lines, series-connected parallel-path diodes and parallel-path capacitances, which can be connected respectively in parallel with the oscillator capacitance by setting of the operating point of the parallel-diodes with the aid of a switchable DC voltage network.

In the case of the component according to the invention, the parallel-path capacitances are connected in parallel with the oscillator capacitance by setting of the operating point of the parallel-path diodes. Consequently, the actual conductor network that serves for the trimming contains no switching elements such as fusible links or transistors whose electrical properties can impair the effect of the conductor network. Such results occur because, in the conducting state, both transistors and fusible links have a comparatively high non-reactive resistance that lowers the quality factor of the conductor network and, hence, of the resonant circuit. By contrast, diodes have a low non-reactive resistance in the conducting state. In the case of the component according to the invention, therefore, the switching function in the conductor network is realized by the parallel-path diodes. The switching elements required for setting the operating point of the parallel-path diodes are situated in the DC voltage network and, consequently, do not impair the quality factor of the conductor network.

In accordance with another feature of the invention, the series-path lines include a trimming line connected to the resonant circuit through the coupling capacitance and a ground line.

In accordance with a further feature of the invention, there is provided a voltage divider setting a potential of the trimming line to a value between a potential of a supply voltage and a potential of the ground line.

In accordance with an added feature of the invention, the each of the parallel-path diodes is a diode having a cathode connected to the trimming line.

In accordance with an additional feature of the invention, the diode is a PIN diode.

In accordance with yet another feature of the invention, each of the parallel-path capacitances is a capacitor connected to the ground line.

In accordance with yet a further feature of the invention, each of the parallel-path diodes has an anode, and there is provided one of a pull-up resistor and a switching element, the switching element selectively setting the anode of each of the parallel-path diodes to one of a potential of a supply voltage through the pull-up resistor and a potential of the ground line.

In accordance with yet an added feature of the invention, the switching element is a fusible link.

In accordance with yet an additional feature of the invention, there is provided a fusing input connected to the fusible link.

In accordance with again another feature of the invention, there are provided series resistors each respectively protecting the anode of the parallel-path diodes.

In accordance with again a further feature of the invention, each of the parallel-path diodes has an anode, and including one of a pull-up resistor and a switching element, the switching element selectively setting the anode of each of the parallel-path diodes to one of a potential of a supply voltage through the pull-up resistor and a potential of the ground line.

In accordance with again an added feature of the invention, there is provided a pull-up resistor, each of the parallel-path diodes having an anode selectively being set to a potential of a supply voltage through the pull-up resistor.

In accordance with again an additional feature of the invention, each of the parallel-path diodes has an anode and a switching element selectively sets each anode of the parallel-path diodes to a potential of the ground line.

In accordance with still another feature of the invention, each of the parallel-path diodes has an anode and switching elements selectively set a respective one of the anodes of the parallel-path diodes to a potential of the ground line.

With the objects of the invention in view, there is also provided an electronic component, including an integrated radiofrequency circuit having a tuning diode, a resonant circuit connected to the tuning diode, the resonant circuit having a resonant frequency and an oscillator capacitance having a value set in a predetermined frequency range by the tuning diode, a coupling capacitance connected to the resonant circuit, and a conductor network for compensation of production related deviations in the resonant frequency, the conductor network being coupled to the resonant circuit through the coupling capacitance and having series-path lines, series-connected parallel-path diodes each having an operating point, the series-connected parallel-path diodes disposed between the series-path lines, parallel-path capacitances disposed between the series-path lines, and a switchable DC voltage network, the parallel-path diodes and the parallel-path capacitances respectively being connected in parallel with the oscillator capacitance when the operating point of the parallel-path diodes is set with the DC voltage network.

Other features that are considered as characteristic for the invention are set forth in the appended claims.

Although the invention is illustrated and described herein as embodied in a component having an integrated radiofrequency circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE is a circuit configuration according to the invention for an integrated component having a resonant circuit that can be trimmed by a conductor network.

DESCRIPTION OF THE PREFERRED EMBODIMENTS

Referring now to the single FIGURE of the drawing, it is seen that the circuit configuration has a resonant circuit 1 that has an inductance 2 and a pair of series-connected variable-capacitance diodes 3 connected in mutually opposite polarity. Connected between the variable-capacitance diodes 3 is a tuning line 4, which leads through a series resistor 5 to a tuning input 6. The resonant circuit 1 is connected to an oscillator output 8 through an external coupling capacitor 7. Moreover, a ground line 9 is led to a ground terminal 10.

The capacitance of the variable-capacitance diodes 3 can be altered by a tuning voltage $V_{tune}$ present at the tuning input 6. Accordingly, the resonant frequency of the resonant circuit 1 is shifted. However, the production of the variable-capacitance diodes 3 generally leads to fluctuations in the electrical properties of the variable-capacitance diodes 3. To produce a specified relationship between the resonant frequency of the resonant circuit and the tuning voltage $V_{tune}$ present at the tuning input 6, it is, therefore, necessary to provide a trimming possibility.

In the case of the circuit configuration of the FIGURE of the drawing, the resonant circuit 1 is realized with the aid of a conductor network 12, which is connected to the resonant circuit 1 through an internal coupling capacitor 11. The conductor network 12 has a trimming line 13, which leads to the coupling capacitor 11 and whose potential is held at a value between the potential of the ground line 9 and the potential of a supply voltage $V_{dd}$ by non-reactive resistors 14 and 15 having the value R' and R". The voltage divider formed by non-reactive resistors 14 and 15 is connected between the ground line 9 and a supply voltage input 16.

The cathodes of PIN diodes 17 are connected to the trimming line 13. The PIN diodes 17 are connected in series with trimming capacitors 18, which are connected to the ground line 9. The anodes of the PIN diodes 17 can optionally be put at the potential of the supply voltage present at the supply voltage input 16 or at the potential of the ground line 9 through pull-up resistors 19 and fusible links 20. In particular, if the fusible links 20 are closed, the trimming capacitors 18 are bridged by the fusible link 20 and parallel resistors 21.

Finally, fusing current inputs 21 are provided, by which a fusing current can be passed through the fusible links 20 to the ground line 9.

The function of the conductor network 12 is explained below with reference to an element of the conductor network 12.

As already mentioned, the trimming line 13 lies at a potential that lies between the potential of the ground line 9 and the potential of the supply voltage $V_{dd}$. If the fusible link 20 is closed, the anode of the assigned PIN diode 17 is pulled to the potential of the ground line 9. As a result, the PIN diode 17 is reverse-biased. As a result, the PIN diode acts like a capacitor whose capacitance is virtually independent of the value of the DC voltage dropped across the PIN diode 17. Two series-connected capacitances are present in terms of radiofrequency technology. If the trimming capacitor 18 and the PIN diode 17 respectively have the capacitance value C, a total capacitance having the value C/2, thus, results.

Conversely, if the fusible link 20 is open, the pull-up resistor 19 and the parallel resistor 21 pull the anode of the PIN diode 17 to the potential of the supply voltage $V_{dd}$. As a result, the PIN diode 17 is forward-biased and acts only as a small non-reactive resistor in terms of radiofrequency technology. Therefore, only the capacitance of the trimming capacitor 18 acts in terms of radiofrequency technology. The chain formed by the PIN diode 17 and the trimming capacitor 18, thus, has the total capacitance C.

If n elements of the conductor network 12 are disposed next to one another in a parallel circuit, it is possible to generate $2^n$ different resonances in the resonant circuit 1. In the exemplary embodiment illustrated in the FIGURE, the capacitances of the trimming capacitor 18 and of the PIN diode 17 in the first element have been set to the value $C_0$. In the second element, the capacitance $C_1$ of the trimming capacitor 18 and of the PIN diode 17 was set equal to $2C_o$. Finally, in the third cell, the capacitances $C_2$ of the trimming capacitor 18 and of the PIN diode 17 were fixed equal to $4C_0$. The values presented in Table 1 are, thus, possible for the total capacitance.

TABLE 1

| F2 | F1 | F0 | Total capacitance |
|---|---|---|---|
| 0 | 0 | 0 | $C_2 + C_1 + C_0 = 7C_0$ |
| 0 | 0 | 1 | $C_2 + C_1 + C_0/2 = 6.5C_0$ |
| 0 | 1 | 0 | $c_2 + c_1/2 + c_0 = 6c_0$ |
| 0 | 1 | 1 | $c_2 + c_1/2 + c_0/2 = 5.5c_0$ |
| 1 | 0 | 0 | $c_2/2 + c_1 + c_0 = 5c_0$ |
| 1 | 0 | 1 | $c_2/2 + c_1 + c_0/2 = 4.5c_0$ |
| 1 | 1 | 0 | $c_2/2 + c_1/2 + c_0 = 4c_0$ |
| 1 | 1 | 1 | $c_2/2 + c_1/2 + c_0/2 = 3.5c_0$ |

A dimensioning example is specified below for the circuit configuration from the FIGURE. In such a case, the resonant circuit 1 is intended to be configured for a frequency of 1 GHz. For such a purpose, the capacitance of the variable-capacitance diodes 3 is set to the value $C_j=4$ pF. The inductance 2 is dimensioned with L=8 nH.

Three switching elements are additionally provided. The trimming capacitors 18 have the values $C_2=1$ pF, $C_1=0.5$ pF and $C_0=0.25$ pF in the dimensioning example. The PIN diodes 17 have the capacitance values $C_{j2}=1$ pF, $C_{j1}=0.5$ pF and $C_{j0}=0.25$ pF. The values of the non-reactive resistors 14 and 15 and also of the resistors 19 and 21 are chosen accordingly. The resistors 19 and 21 have the following values: $R_{12}=25$ kohms, $R_{11}=50$ kohms, $R_{10}=100$ kohms, $R_{22}=25$ kohms, $R_{21}=50$ kohms, and $R_{20}=100$ kohms. The value of the resistor 14 is R'=20 kohms and the resistance of the resistor 15 is R"=10 kohms, so that, given a supply voltage of $V_{DD}=3$ V, a potential of $V_{high}=1$ V is established on the trimming line 13 if all the fusible links 20 are closed. By contrast, if all the fusible links 20 are open, a potential of $V_{high}=1.4$ V results on the trimming line 13.

The voltage drop across the PIN diodes 17 with current of 10 μA being impressed in the forward direction is 0.7 V and dependent only to a small extent on the current so that the currents in $R_{1n}$ and $R_{2n}$ are calculated as follows: $I_n=(V_{DD}-0.7-V_{high})/(R_{1n}+R_{2n})$. Accordingly, the following result for the currents: $I_2=20$ μA, $I_1=10$ μA and $I_0=5$ μA.

With these currents, the PIN diodes 17 have the following series resistances at 1 GHz: $R_{j2}=1.25$ ohms, $R_{j1}=2.5$ ohms, and $R_{j0}=5$ ohms. The series resistances can be transformed into a parallel resistance with respect to the capacitor that supplies the same value of about 20 kohms in each branch: $R_p=1/(\omega^2 C^2 R_S)=20$ kohms, which corresponds to a conductance of $G_p=0.00005$ siemen.

Then, the radiofrequency quality factor of the circuit configuration can be determined by summing all the parallel conductances for the case where all the fusible links 20 are open: $Q=\omega c_{total}/G_{p\ total}=(2\pi*10^9)*(3.3*10^{-12})/0.00033=62$.

For the case where all the fuses are closed, a higher value of about 100 results because, in such a case, the reverse-biased PIN diodes 17 yield few losses.

It is noted that transistors can also be used instead of the fusible links 20. Such transistors are expediently controlled by a microprocessor. The exact electrical properties of the respective transistor are unimportant in such a case because the transistor is situated in the DC voltage network and the actual circuit function is performed by the PIN diode 17.

We claim:

1. An integrated radiofrequency circuit component, comprising:
   a tuning diode;
   a resonant circuit connected to said tuning diode, said resonant circuit having:
     a resonant frequency; and
     an oscillator capacitance having a value set in a predetermined frequency range by said tuning diode;
   a coupling capacitance connected to said resonant circuit; and
   a conductor network for compensation of production related deviations in said resonant frequency, said conductor network being coupled to said resonant circuit through said coupling capacitance and having:
     series-path lines;
     series-connected parallel-path diodes each having an operating point, said series-connected parallel-path diodes disposed between said series-path lines;
     parallel-path capacitances disposed between said series-path lines; and
     a switchable DC voltage network, said parallel-path diodes and said parallel-path capacitances respectively being connected in parallel with said oscillator capacitance when said operating point of said parallel-path diodes is set with said DC voltage network.

2. The component according to claim 1, wherein said series-path lines include:
   a trimming line connected to said resonant circuit through said coupling capacitance; and
   a ground line.

3. The component according to claim 2, including a voltage divider setting a potential of said trimming line to a value between a potential of a supply voltage and a potential of said ground line.

4. The component according to claim 2, wherein each of said parallel-path diodes is a diode having a cathode connected to said trimming line.

5. The component according to claim 4, wherein said diode is a PIN diode.

6. The component according to claim 3, wherein each of said parallel-path diodes is a diode having a cathode connected to said trimming line.

7. The component according to claim 6, wherein said diode is a PIN diode.

8. The component according to claim 2, wherein each of said parallel-path capacitances is a capacitor connected to said ground line.

9. The component according to claim 2, wherein each of said parallel-path diodes has an anode, and including one of a pull-up resistor and a switching element, said switching element selectively setting said anode of each of said parallel-path diodes to one of:
   a potential of a supply voltage through said pull-up resistor; and
   a potential of said ground line.

10. The component according to claim 9, wherein said switching element is a fusible link.

11. The component according to claim 10, including a fusing input connected to said fusible link.

12. The component according to claim 11, including series resistors each respectively protecting said anode of said parallel-path diodes.

13. The component according to claim 6, wherein each of said parallel-path diodes has an anode, and including one of a pull-up resistor and a switching element, said switching element selectively setting said anode of each of said parallel-path diodes to one of:
 a potential of a supply voltage through said pull-up resistor; and
 a potential of said ground line.

14. The component according to claim 2, including a pull-up resistor, each of said parallel-path diodes having an anode selectively being set to a potential of a supply voltage through said pull-up resistor.

15. The component according to claim 2, wherein:
 each of said parallel-path diodes has an anode; and
 a switching element selectively sets each anode of said parallel-path diodes to a potential of said ground line.

16. The component according to claim 2, wherein:
 each of said parallel-path diodes has an anode; and
 switching elements selectively set a respective one of said anodes of said parallel-path diodes to a potential of said ground line.

17. An electronic component, comprising:
 an integrated radiofrequency circuit having:
  a tuning diode;
  a resonant circuit connected to said tuning diode, said resonant circuit having:
   a resonant frequency; and
   an oscillator capacitance having a value set in a predetermined frequency range by said tuning diode;
  a coupling capacitance connected to said resonant circuit; and
  a conductor network for compensation of production related deviations in said resonant frequency, said conductor network being coupled to said resonant circuit through said coupling capacitance and having:
   series-path lines;
   series-connected parallel-path diodes each having an operating point, said series-connected parallel-path diodes disposed between said series-path lines;
   parallel-path capacitances disposed between said series-path lines; and
   a switchable DC voltage network, said parallel-path diodes and said parallel-path capacitances respectively being connected in parallel with said oscillator capacitance when said operating point of said parallel-path diodes is set with said DC voltage network.

* * * * *